US007575982B2

(12) United States Patent
Bour et al.

(10) Patent No.: US 7,575,982 B2
(45) Date of Patent: Aug. 18, 2009

(54) STACKED-SUBSTRATE PROCESSES FOR PRODUCTION OF NITRIDE SEMICONDUCTOR STRUCTURES

(75) Inventors: David Bour, Cupertino, CA (US); Sandeep Nijhawan, Los Altos, CA (US); Lori Washington, Union City, CA (US); Jacob Smith, Santa Clara, CA (US); David Eaglesham, Livermore, CA (US)

(73) Assignee: Applied Materials, Inc., Santa Clara, CA (US)

( * ) Notice: Subject to any disclaimer, the term of this patent is extended or adjusted under 35 U.S.C. 154(b) by 285 days.

(21) Appl. No.: 11/404,525

(22) Filed: Apr. 14, 2006

(65) Prior Publication Data

US 2007/0243652 A1    Oct. 18, 2007

(51) Int. Cl.
*H01L 21/30* (2006.01)
(52) U.S. Cl. ............... 438/457; 438/458; 257/E21.121
(58) Field of Classification Search .................. 438/46, 438/928, 977, 455–459; 257/E21.568, E21.119, 257/E21.121
See application file for complete search history.

(56) References Cited

U.S. PATENT DOCUMENTS

| 4,830,984 | A | * | 5/1989 | Purdes ........................ 438/492 |
| 5,449,659 | A | * | 9/1995 | Garrison et al. ............. 505/330 |
| 5,620,557 | A | * | 4/1997 | Manabe et al. .............. 438/507 |
| 5,882,413 | A | * | 3/1999 | Beaulieu et al. ............. 118/719 |
| 5,905,275 | A | * | 5/1999 | Nunoue et al. ................ 257/95 |
| 2003/0033974 | A1 | * | 2/2003 | Ueda ........................... 117/84 |
| 2004/0072383 | A1 | * | 4/2004 | Nagahama et al. ........... 438/47 |
| 2006/0049487 | A1 | * | 3/2006 | Sato et al. ................... 257/620 |
| 2006/0292822 | A1 | * | 12/2006 | Xie ............................ 438/455 |
| 2007/0241351 | A1 | * | 10/2007 | Nijhawan et al. ............ 257/94 |
| 2007/0243702 | A1 | * | 10/2007 | Nijhawan et al. .......... 438/602 |
| 2008/0169532 | A1 | * | 7/2008 | Nakahata et al. ............ 257/615 |

FOREIGN PATENT DOCUMENTS

KR    2001098142 A * 11/2001
WO    WO 2005076345 A1 * 8/2005

* cited by examiner

*Primary Examiner*—W. David Coleman
*Assistant Examiner*—Latanya Crawford
(74) *Attorney, Agent, or Firm*—Townsend and Townsend and Crew LLP

(57) ABSTRACT

Methods are provided of fabricating compound nitride semiconductor structures. A group-III precursor and a nitrogen precursor are flowed into a processing chamber to deposit a first layer over a surface of a first substrate with a thermal chemical-vapor-deposition process. A second layer is deposited over a surface of a second substrate with the thermal chemical-vapor-deposition process using the first group-III precursor and the first nitrogen precursor. The first and second substrates are different outer substrates of a plurality of stacked substrates disposed within the processing chamber as a stack so that the first and second layers are deposited on opposite sides of the stack. Deposition of the first layer and deposition of the second layer are performed simultaneously.

12 Claims, 10 Drawing Sheets

STACKED-SUBSTRATE PROCESSES FOR PRODUCTION OF NITRIDE SEMICONDUCTOR STRUCTURES

CROSS-REFERENCES TO RELATED APPLICATIONS

This application is related to concurrently filed, commonly assigned U.S. patent application Ser. No. 11/404,390, entitled "DUAL-SIDE EPITAXY PROCESSES FOR PRODUCTION OF NITRIDE SEMICONDUCTOR STRUCTURES," by Sandeep Nijhawan et al., and to concurrently filed, commonly assigned U.S. patent application Ser. No. 11/404,642, entitled "DOUBLE-SIDED NITRIDE STRUCTURES," by Sandeep Nijhawan, the entire disclosure of which is incorporated herein by reference for all purposes.

BACKGROUND OF THE INVENTION

The history of light-emitting diodes ("LEDs") is sometimes characterized as a "crawl up the spectrum." This is because the first commercial LEDs produced light in the infrared portion of the spectrum, followed by the development of red LEDs that used GaAsP on a GaAs substrate. This was, in turn, followed by the use of GaP LEDs with improved efficiency that permitted the production of both brighter red LEDs and orange LEDs. Refinements in the use of GaP then permitted the development of green LEDs, with dual GaP chips (one in red and one in green) permitting the generation of yellow light. Further improvements in efficiency in this portion of the spectrum were later enabled through the use of GaAlAsP and InGaAlP materials.

This evolution towards the production of LEDs that provide light at progressively shorter wavelengths has generally been desirable not only for its ability to provide broad spectral coverage but because diode production of short-wavelength light may improve the information storage capacity of optical devices like CD-ROMs. The production of LEDs in the blue, violet, and ultraviolet portions of the spectrum was largely enabled by the development of nitride-based LEDs, particularly through the use of GaN. While some modestly successful efforts had previously been made in the production of blue LEDs using SiC materials, such devices suffered from poor luminescence as a consequence of the fact that their electronic structure has an indirect bandgap.

While the feasibility of using GaN to create photoluminescence in the blue region of the spectrum has been known for decades, there were numerous barriers that impeded their practical fabrication. These included the lack of a suitable substrate on which to grow the GaN structures, generally high thermal requirements for growing GaN that resulted in various thermal-convection problems, and a variety of difficulties in efficient p-doping such materials. The use of sapphire as a substrate was not completely satisfactory because it provides approximately a 15% lattice mismatch with the GaN. Progress has subsequently been made in addressing many aspects of these barriers. For example, the use of a buffer layer of AlN or GaN formed from a metalorganic vapor has been helpful in accommodating the lattice mismatch. Further refinements in the production of Ga-N-based structures has included the use of AlGaN materials to form heterojunctions with GaN and particularly the use of InGaN, which causes the creation of defects that act as quantum wells to emit light efficiently at short wavelengths. Indium-rich regions have a smaller bandgap than surrounding material, and may be distributed throughout the material to provide efficient emission centers.

While some improvements have thus been made in the manufacture of such compound nitride semiconductor devices, it is widely recognized that a number of deficiencies yet exist in current manufacturing processes. Moreover, the high utility of devices that generate light at such wavelengths has caused the production of such devices to be an area of intense interest and activity. In view of these considerations, there is a general need in the art for improved methods and systems for fabricating compound nitride semiconductor devices.

BRIEF SUMMARY OF THE INVENTION

Embodiments of the invention provide methods of fabricating nitride and other structures that make use of stacked-substrate arrangements. In a first set of embodiments, methods are provided of fabricating compound nitride semiconductor structures. A first group-III precursor and a first nitrogen precursor are flowed into a first processing chamber. The first group-III precursor comprises a first group-III element. A first layer is deposited over a surface of a first substrate with a thermal chemical-vapor-deposition process within the first processing chamber using the first group-III precursor and the first nitrogen precursor. The first layer comprises nitrogen and the first group-III element. A second layer is deposited over a surface of a second substrate with the thermal chemical-vapor-deposition process within the first processing chamber using the first group-r precursor and the first nitrogen precursor. The second layer comprises nitrogen and the first group-III element. The first and second substrates are different outer substrates of a plurality of stacked substrates disposed within the first processing chamber as a stack. The first and second layers are deposited on opposite sides of the stack. Deposition of the first layer and deposition of the second layer are performed simultaneously.

In some embodiments, the plurality of stacked substrates are bonded together. For example, the stacked substrates may be bonded together with a semiconductor-to-semiconductor bond, a metal bond, a sol-gel ceramic bond, a spin-on-glass bond, or the like. The first and second substrates may be split from the stack after depositing the first layer and depositing the second layer. For instance, an acid etch may be used to decompose the bond, the bond may be exposed to ultraviolet light to decompose the bond, a mechanical fracture of the bond may be induced, or the stack may be cooled to induce a splitting force from a differential thermal expansion in different embodiments. When the substrates are bonded together, the stack may be cooled after depositing the first and second layers without substantially deforming a shape of the first substrate or a shape of the second substrate. The surface of the first substrate and the surface of the second substrate may be radiatively heated simultaneously with plates disposed on opposite sides of the stack.

In some instances, the first layer and the second layer are deposited at a first temperature. A third layer is deposited over the first layer with a thermal chemical-vapor-deposition process. The third layer comprises nitrogen and a second group-III element not comprised by the first group-III precursor. A fourth layer is deposited over the second layer with a thermal chemical-vapor-deposition process. The fourth layer comprises nitrogen and the second group-III element. Deposition of the third layer and deposition of the fourth layer are performed simultaneously at a second temperature less than the fait temperature. In some instances, deposition of the third layer and deposition of the fourth layer are performed in the first processing chamber. In other instances, deposition of the third layer and deposition of the fourth layer are performed in a second processing chamber different from the first processing chamber, in which case the method further comprises transferring the substrate from the first processing chamber to the second processing chamber after depositing the first and second layers.

In certain embodiments, the stack may also comprise an infrared absorber disposed between the first and second substrates. Examples of suitable infrared absorbers include plates comprising SiC, SiC-coated graphite, or molybdenum.

In a second set of embodiments, methods are provided of fabricating structures. A first layer is deposited over a surface of a first substrate with a thermal chemical-vapor-deposition process. The first substrate has a first coefficient of thermal expansion and the first layer has a second coefficient of thermal expansion different from the first coefficient of thermal expansion. A second layer is deposited over a surface of a second substrate with the thermal chemical-vapor-deposition process. The second layer has the second coefficient of thermal expansion and the second substrate has a third coefficient of thermal expansion different from the second coefficient of thermal expansion. At least the first and second substrates are different outer substrates of a plurality of stacked substrates disposed within a processing chamber as a stack. The first layer and second layer are deposited on opposite sides of the stack. Deposition of the first layer and deposition of the second layer are performed simultaneously.

In some embodiments, the third coefficient of thermal expansion is substantially the same as the first coefficient of thermal expansion. A number of variations on these methods may be implemented similarly to those described in connection with the first set of embodiments.

BRIEF DESCRIPTION OF THE DRAWINGS

A further understanding of the nature and advantages of the present invention may be realized by reference to the remaining portions of the specification and the drawings wherein like reference numerals are used throughout the several drawings to refer to similar components. In some instances, a sublabel is associated with a reference numeral and follows a hyphen to denote one of multiple similar components. When reference is made to a reference numeral without specification to an existing sublabel, it is intended to refer to a such multiple similar components.

DETAILED DESCRIPTION OF THE INVENTION

1. Overview

One of the difficulties mentioned above in fabricating nitride-based structures such as GaN structures is the accommodation of generally high thermal requirements for growth of GaN. Historically, this made the identification of a suitable substrate difficult, with the art more recently focusing on ways in which the use of sapphire $Al_2O_3$ may be accommodated. Sapphire is not an ideal substrate because there is a significant lattice mismatch with deposited nitride layers; in the specific case of GaN, this lattice mismatch is approximately 15%. While the use of a nitride buffer layer has been helpful in accommodating the lattice mismatch, both the lattice mismatch and other physical differences between the sapphire substrate and overlying nitride layer result in distortions of resulting structures.

Figure 1:
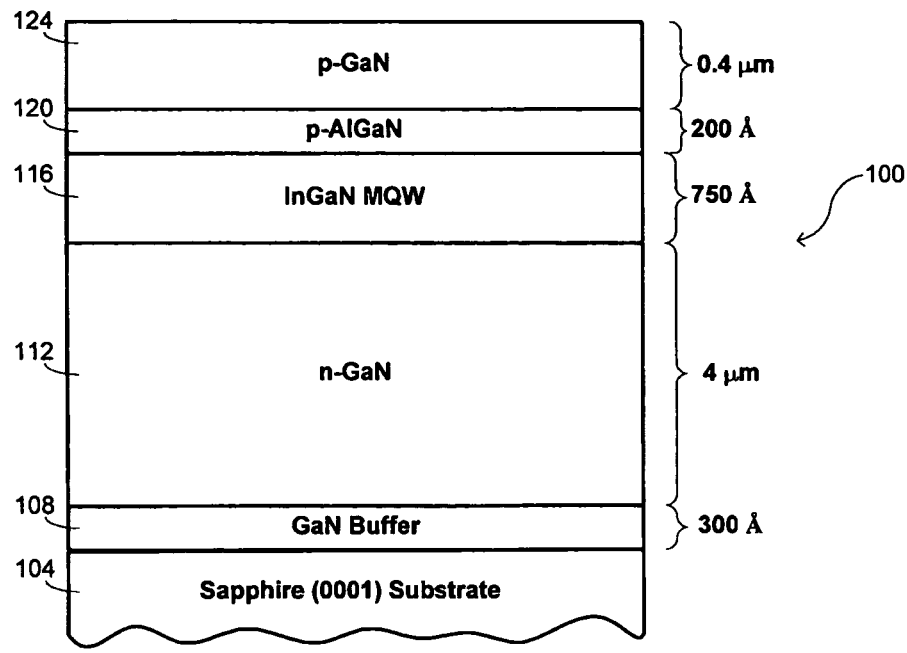
FIG. 1 provides a schematic illustration of a structure of a GaN-based LED.

One typical nitride-based structure is illustrated in FIG. 1 as a GaN-based LED structure 100. It is fabricated over a sapphire (0001) substrate 104. An n-type GaN layer 112 is deposited over a GaN buffer layer 108 formed over the substrate. An active region of the device is embodied in a multi-quantum-well layer 116, shown in the drawing to comprise an InGaN layer. A pn junction is formed with an overlying p-type AlGaN layer 120, with a p-type GaN layer 124 acting as a contact layer.

A typical fabrication process for such an LED may use a metalorganic chemical-vapor-deposition ("MOCVD") process that follows cleaning of the substrate 104 in a processing chamber. The MOCVD deposition is accomplished by providing flows of suitable precursors to the processing chamber and using thermal processes to achieve deposition. For example, a GaN layer may be deposited using Ga and N precursors, perhaps with a flow of a fluent gas like $N_2$, $H_2$, and/or $NH_3$; an InGaN layer may be deposited using Ga, N. and In precursors, perhaps with a flow of a fluent gas; and an AlGaN layer may be deposited using Ga, N. and Al precursors, also perhaps with a flow of a fluent gas. In the illustrated structure 100, the GaN buffer layer 108 has a thickness of about 300 Å, and may have been deposited at a temperature of about 550° C. Subsequent deposition of the n-GaN layer 112 is typically performed at a higher temperature, such as around 1050° C. in one embodiment. The n-GaN layer 112 is relatively thick, with deposition of a thickness on the order of 4 μm requiring about 140 minutes. The InGaN multi-quantumwell layer 116 may have a thickness of about 750 Å, which may be deposited over a period of about 40 minutes at a temperature of about 750° C. The p-AlGaN layer 120 may have a thickness of about 200 Å, which may be deposited in about five minutes at a temperature of 950° C. The thickness of the contact layer 124 that completes the structure may be about 0.4 µm in one embodiment, and may be deposited at a temperature of about 1050° C. for around 25 minutes.

Figure 2A:
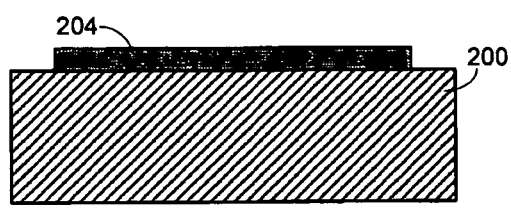
FIGS. 2A and 2B illustrate how physical differences between a substrate and material deposited on a substrate may result in shape distortions of nitride-based structures.
Figure 2B:
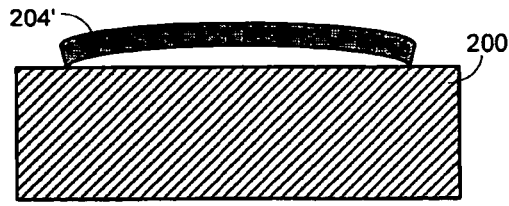

An illustration of the type of shape distortion that may result from such a deposition process is illustrated schematically with FIGS. 2A and 2B. As illustrated with the description of the structure shown in FIG. 1, fabrication processes of nitride structures may include a number of temperature changes and consistently take place at temperatures elevated from normal operational temperatures of the completed structures. In addition to there being a lattice mismatch between sapphire and GaN, such materials have different coefficients of thermal expansion, causing differences in thermal expansion at different processing temperatures. This effect is generally even more significant than the lattice mismatch in causing shape distortions. The effect is illustrated schematically in FIGS. 2A and 2B. In these drawings, element 200 is a substrate holder, over which the structure 204 being fabricated is disposed. The two drawings are at different points in time during a fabrication process, with FIG. 2B corresponding to a later time than FIG. 2A and at a lower temperature than FIG. 2A Such a sequence may occur in a variety of different fabrication processes for nitride structures. In the specific case of the structure shown in FIG. 1, for example, FIG. 2A may correspond to a point in time during epitaxy of the n-GaN layer 112 when the temperature is about 1050° C. and FIG. 2B may correspond to a point in time during growth of the InGaN active region 116 when the temperature is about 750° C. Notably, FIG. 2B could also correspond to a point in time after the entire structure has been fabricated and cooled down to room temperature.

It is evident from the drawing that the structure 204' at the cooler temperature is deformed with a center that is bowed upwards when compared with the structure 204 at the higher temperature. This bowing results from the differential thermal expansion between GaN and sapphire. Deposition may occur with a flat geometry at the temperatures used for GaN growth as shown in FIG. 2A. But when the structure is subsequently cooled for deposition of the InGaN active region, the substrate center bows upwards and becomes somewhat cooler than the edges. This temperature nonuniformity over the surface of the structure results in a nonuniformity in indium distribution in the deposited InGaN, with indium-rich regions tending to form at the center of the substrate and indium-poor regions tending to form at the periphery of the substrate. In turn, this nonuniformity in indium distribution translates into wavelength and light-output variations for devices formed across the structure, limiting the scale-up of the process for producing these materials.

Figure 3A:
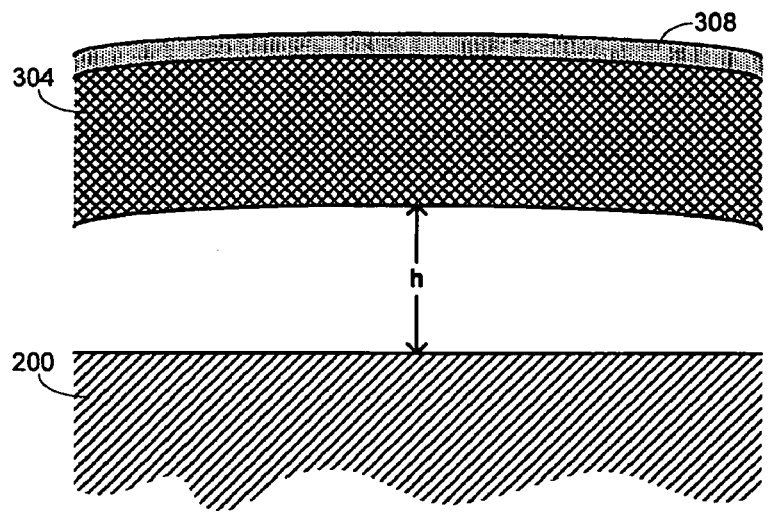
FIGS. 3A and 3B provide a quantification of the shape distortions illustrated in FIG. 2B for different nitride-based structures.
Figure 3B:
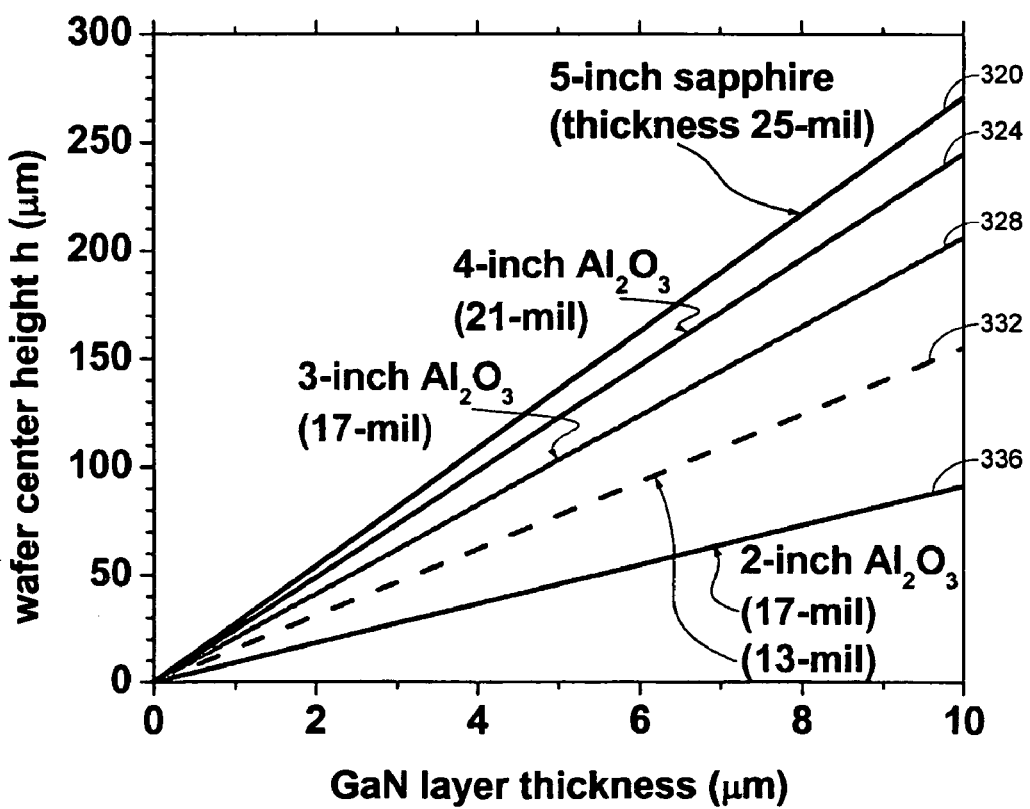

The magnitude of the bowing depends on such factors as the thickness of the substrate, the thickness of the GaN epitaxial layer, and the growth temperature. Results quantifying the effect of the relative thicknesses of the substrate and GaN epitaxial layer are presented with FIGS. 3A and 3B. FIG. 3A illustrates the arrangement that was studied and how the effect was quantified. Namely, a GaN epitaxial layer 208 was deposited over a sapphire substrate 304 at a temperature of 1050° C. The amount of bowing was quantified by the height h of the center of the substrate 304 over a substrate support holder after cooling the structure to room temperature. Results are presented in FIG. 3B for sapphire substrates having commonly used diameters and thicknesses. Line 320 shows results for deposition on a five-inch sapphire substrate having a thickness of 25 mil; line 324 shows results for deposition on a four-inch sapphire substrate having a thickness of 21 mil; line 328 shows results for deposition on a three-inch sapphire substrate having a thickness of 17 mil; line 332 shows results for deposition on a two-inch sapphire substrate having a thickness of 13 mil; and line 336 shows results for deposition on a two-inch sapphire substrate having a thickness of 17 mil. The results exhibit general trends in which the bowing is more pronounced both with a larger-diameter substrate, a thinner substrate, and with a thicker layer of deposited GaN, reflecting the fact that the differential in thermal expansion may be increased with either portion of the structure.

Embodiments of the invention mitigate this effect by depositing material on two sides of a substrate or substrate stack. While it is generally preferred that the deposition on the two sides take place simultaneously, this is not a requirement of the invention and deposition may sometimes take place sequentially. The bowing effect is mitigated by such processes because the tendency of the structure to bow on one side is counteracted by an opposite tendency of the structure to bow in the opposite direction on the other side.

In some instances, deposition on one side of the substrate is a sacrificial deposition, with devices ultimately being fabricated from the deposition on the other side of the substrate. In other instances, though, the deposition on both sides of the substrate is used to fabricate devices. This advantageously improves the overall throughput of the fabrication processes. Conventional fabrication with multiple epitaxial deposition steps being performed in a single reactor in a single session results in a long processing time, usually on the order of 4-6 hours. This long processing time is manifested by low reactor throughput, which is often addressed by the use of batch processing techniques. For instance, commercial reactors used in production processes may operate simultaneously on 20-50 two-inch wafers, which results in relatively poor yield. The ability to deposit material on both sides of a substrate may significant enhance overall productivity, even with the relatively long processing time. Furthermore, in some embodiments, different processing steps may be performed in different processing chambers especially adapted for deposition of different types of layers. Such processing may further increase productivity as described in copending, commonly assigned U.S. patent application Ser. No. 11/404,516, entitled "EPITAXAL GROWTH OF COMPOUND NITRIDE SEMICONDUCTOR STRUCTURES," filed by Sandeep Nijhawan et al., the entire disclosure of which is incorporated herein by reference for all purposes.

2. Exemplary Substrate Processing System

Figure 4A:
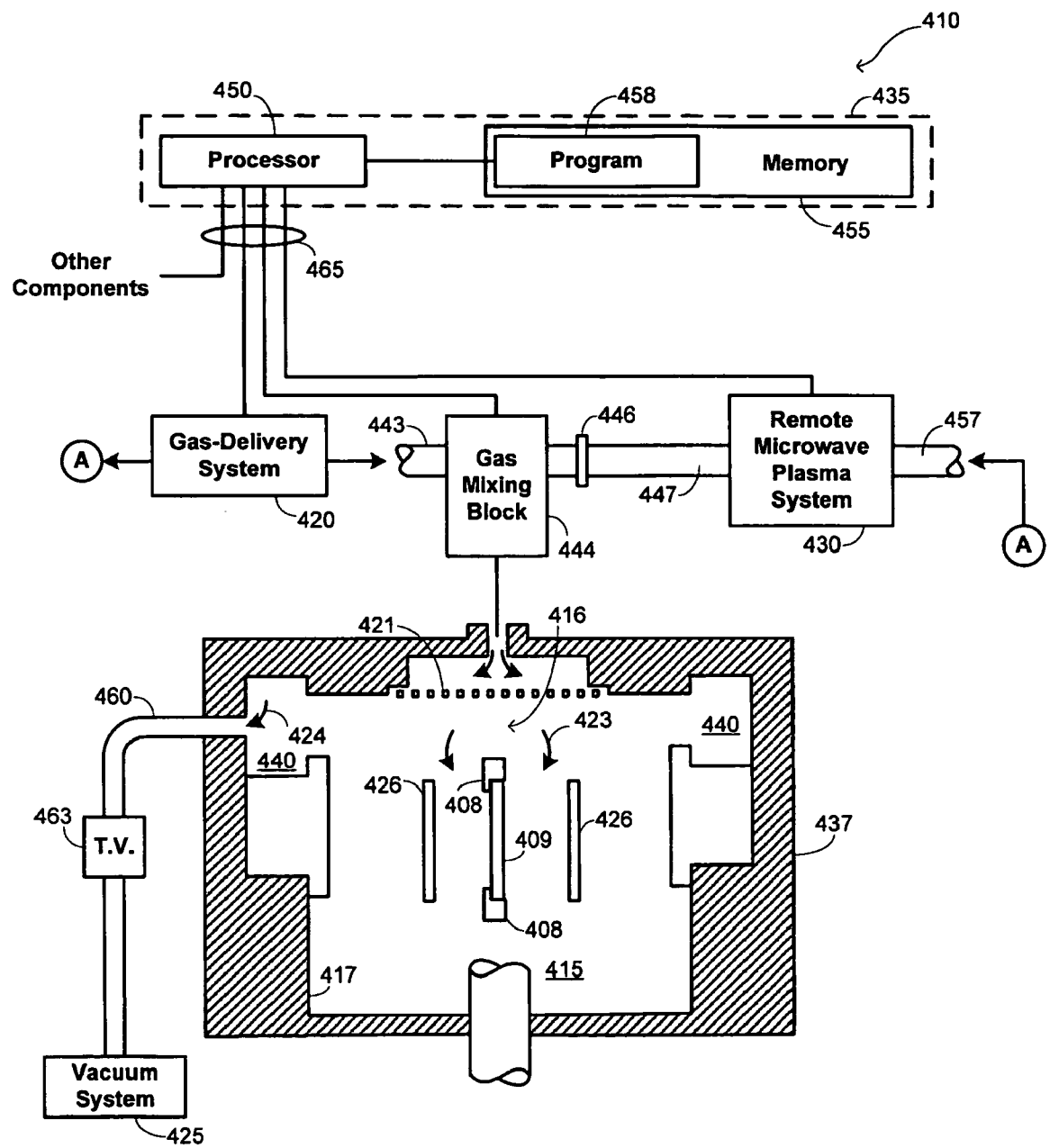
FIG. 4A is a simplified representation of an exemplary CVD apparatus that may be used in implementing certain embodiments of the invention.

FIG. 4A is a simplified diagram of an exemplary chemical vapor deposition ("CVD") system 410, illustrating the basic structure of a chamber in which individual deposition steps can be performed. This system is suitable for performing thermal, sub-atmospheric CVD ("SACVD") processes, as well as other processes, such as reflow, drive-in, cleaning, etching, deposition, and gettering processes. As will be evident from the examples described below, in some instances multiple-step processes can still be performed within an individual chamber before removal for transfer to another chamber. The major components of the system include, among other, a vacuum chamber 415 that receives process and other gases from a gas delivery system 420, a vacuum system 425, a remote plasma system 430, and a control system 435. These and other components are described in more detail below. In addition, specific description of structural arrangements that may be used to enable dual-sided deposition are provided below. While the drawing shows the structure of only a single chamber for purposes of illustration, it will be appreciated that multiple chambers with similar structures may be provided as part of the cluster tool, each tailored to perform different aspects of the overall fabrication process. Other components shown in the drawing for supporting the chamber processing may be shared among the multiple chambers, although in some instances individual supporting components may be provided for each chamber separately.

CVD apparatus 410 includes an enclosure assembly 437 that forms vacuum chamber 415 with a gas reaction area 416. A gas distribution plate 421 disperses reactive gases and other gases, such as purge gases, through perforated holes toward one or more substrates 409 held in position by a substrate support structure 408. Between gas distribution plate 421 and the substrate 409 is gas reaction area 416. Heaters 426 can be controllably moved between different positions to accommodate different deposition processes as well as for an etch or cleaning process. A center board (not shown) includes sensors for providing information on the position of the substrate.

Different structures may be used for heaters 426. For instance, some embodiments of the invention advantageously use a pair of plates in close proximity and disposed on opposite sides of the substrate support structure 408 to provide separate heating sources for the opposite sides of one or more substrates 409. Merely by way of example, the plates may comprise graphite or SiC in certain specific embodiments. In another instance, the heaters 426 include an electrically resistive heating element (not shown) enclosed in a ceramic. The ceramic protects the heating element from potentially corrosive chamber environments and allows the heater to attain temperatures up to about 1200° C. In an exemplary embodiment, all surfaces of heaters 426 exposed to vacuum chamber 415 are made of a ceramic material, such as aluminum oxide ($Al_2O_3$ or alumina) or aluminum nitride. In another embodiment, the heaters 426 comprises lamp heaters. Alternatively, a bare metal filament heating element, constructed of a refractory metal such as tungsten, rhenium, iridium, thorium, or their alloys, may be used to heat the substrate. Such lamp heater arrangements are able to achieve temperatures greater than 1200° C., which may be useful for certain specific applications.

Reactive and carrier gases are supplied from gas delivery system 420 through supply lines 443 into a gas mixing box (also called a gas mixing block) 444, where they are mixed together and delivered to gas distribution plate 421. Gas delivery system 420 includes a variety of gas sources and appropriate supply lines to deliver a selected amount of each source to chamber 415 as would be understood by a person of skill in the art. Generally, supply lines for each of the gases include shut-off valves that can be used to automatically or manually shut-off the flow of the gas into its associated line, and mass flow controllers or other types of controllers that measure the flow of gas or liquid through the supply lines. Depending on the process run by system 410, some of the sources may actually be liquid sources rather than gases. When liquid sources are used, gas delivery system includes a liquid injection system or other appropriate mechanism (e.g., a bubbler) to vaporize the liquid. Vapor from the liquids is then usually mixed with a carrier gas as would be understood by a person of skill in the art.

Gas mixing box 444 is a dual input mixing block coupled to process gas supply lines 443 and to a cleaning/etch gas conduit 447. A valve 446 operates to admit or seal gas or plasma from gas conduit 447 to gas mixing block 444. Gas conduit 447 receives gases from an integral remote microwave plasma system 430, which has an inlet 457 for receiving input gases. During deposition processing, gas supplied to the plate 421 is vented toward the substrate surface (as indicated by arrows 423), where it may be uniformly distributed radially across the substrate surface in a laminar flow.

Purging gas may be delivered into the vacuum chamber 415 from gas distribution plate 421 and/or from inlet ports or tubes (not shown) through the bottom wall of enclosure assembly 437. Purge gas introduced from the bottom of chamber 415 flows upward from the inlet port past the heater 426 and to an annular pumping channel 440; Vacuum system 425 which includes a vacuum pump (not shown), exhausts the gas (as indicated by arrows 424) through an exhaust line 460. The rate at which exhaust gases and entrained particles are drawn from the annular pumping channel 440 through the exhaust line 460 is controlled by a throttle valve system 463.

Remote microwave plasma system 430 can produce a plasma for selected applications, such as chamber cleaning or etching residue from a process substrate. Plasma species produced in the remote plasma system 430 from precursors supplied via the input line 457 are sent via the conduit 447 for dispersion through gas distribution plate 421 to vacuum chamber 415. Remote microwave plasma system 430 is integrally located and mounted below chamber 415 with conduit 447 coming up alongside the chamber to gate valve 446 and gas mixing box 444, which is located above chamber 415. Precursor gases for a cleaning application may include fluorine, chlorine and/or other reactive elements. Remote microwave plasma system 430 may also be adapted to deposit CVD layers flowing appropriate deposition precursor gases into remote microwave plasma system 430 during a layer deposition process.

The temperature of the walls of deposition chamber 415 and surrounding structures, such as the exhaust passageway, may be further controlled by circulating a heat-exchange liquid through channels (not shown) in the walls of the chamber. The heat-exchange liquid can be used to heat or cool the chamber walls depending on the desired effect. For example, hot liquid may help maintain an even thermal gradient during a thermal deposition process, whereas a cool liquid may be used to remove heat from the system during an in situ plasma process, or to limit formation of deposition products on the walls of the chamber. Gas distribution manifold 421 also has heat exchanging passages (not shown). Typical heat-exchange fluids water-based ethylene glycol mixtures, oil-based thermal transfer fluids, or similar fluids. This heating, referred to as heating by the "heat exchanger", beneficially reduces or eliminates condensation of undesirable reactant products and improves the elimination of volatile products of the process gases and other contaminants that might contaminate the process if they were to condense on the walls of cool vacuum passages and migrate back into the processing chamber during periods of no gas flow.

System controller 435 controls activities and operating parameters of the deposition system. System controller 435 includes a computer processor 450 and a computer-readable memory 455 coupled to processor 450. Processor 450 executes system control software, such as a computer program 458 stored in memory 455. Memory 455 is preferably a hard disk drive but may be other kinds of memory, such as read-only memory or flash memory. System controller 435 also includes a floppy disk drive, CD, or DVD drive (not shown).

Precursor 450 operates according to system control software (program 458), which includes computer instructions that dictate the timing, mixture of gases, chamber pressure, chamber temperature, microwave power levels, pedestal position, and other parameters of a particular process. Control of these and other parameters is effected over control lines 465, only some of which are shown in FIG. 4A, that communicatively couple system controller 435 to the heater, throttle valve, remote plasma system and the various valves and mass flow controllers associated with gas delivery system 420.

Processor 450 has a card rack (not shown) that contains a single-board computer, analog and digital input/output boards, interface boards and stepper motor controller boards. Various parts of the CVD system 410 conform to the Versa Modular European (VME) standard which defines board, card cage, and connector dimensions and types. The VMB standard also defines the bus structure having a 16-bit data bus and 44-bit address bus.

Figure 4B:
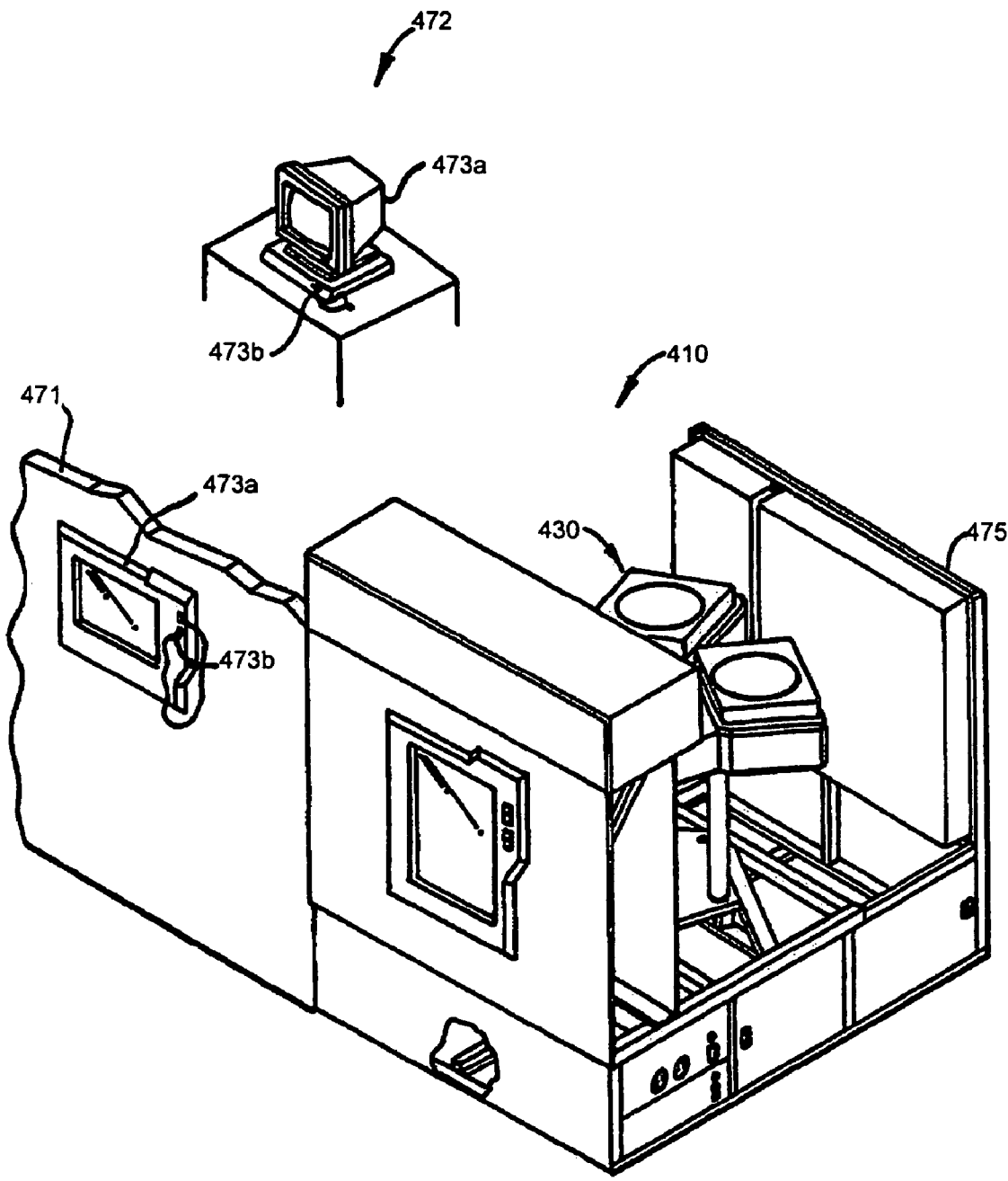
FIG. 4B is a simplified representation of one embodiment of a user interface for the exemplary CVD apparatus of FIG. 4A.

FIG. 4B is a simplified diagram of a user interface that can be used to monitor and control the operation of CVD system 410. FIG. 4B illustrates explicitly the multichamber nature of the cluster tool, with CVD system 410 being one chamber of the multichamber system. In such a multichamber system substrates may be transferred from one chamber to another via a computer-controlled robot for additional processing. In some cases the substrates are transferred under vacuum or a selected gas. The interface between a user and system controller 435 is a CRT monitor 473a and a light pen 473b. A mainframe unit 475 provides electrical plumbing, and other support functions for the CVD apparatus 410. Exemplary multichamber system mainframe units compatible with the illustrative embodiment of the CVD apparatus are currently commercially available as the Precision 5000™ and the Centura 5200™ systems from APPLIED MATERIALS, INC. of Santa Clara, Calif.

In one embodiment two monitors 473a are used, one mounted in the clean room wall 471 for the operators, and the other behind the wall 472 for the service technicians. Both monitors 473a simultaneously display the same information, but only one light pen 473b is enabled. The light pen 473b detects light emitted by the CRT display with a light sensor in the tip of the pen. To select a particular screen or function, the operator touches a designated area of the display screen and pushes the button on the pen 473b. The touched area changes its highlighted color, or a new menu or screen is displayed, confirming communication between the light pen and the display screen. As a person of ordinary skill would readily understand, other input devices, such as a keyboard, mouse, or other pointing or communication device, may be used instead of or in addition to the light pen 473b to allow the user to communicate with the processor.

Figure 4C:
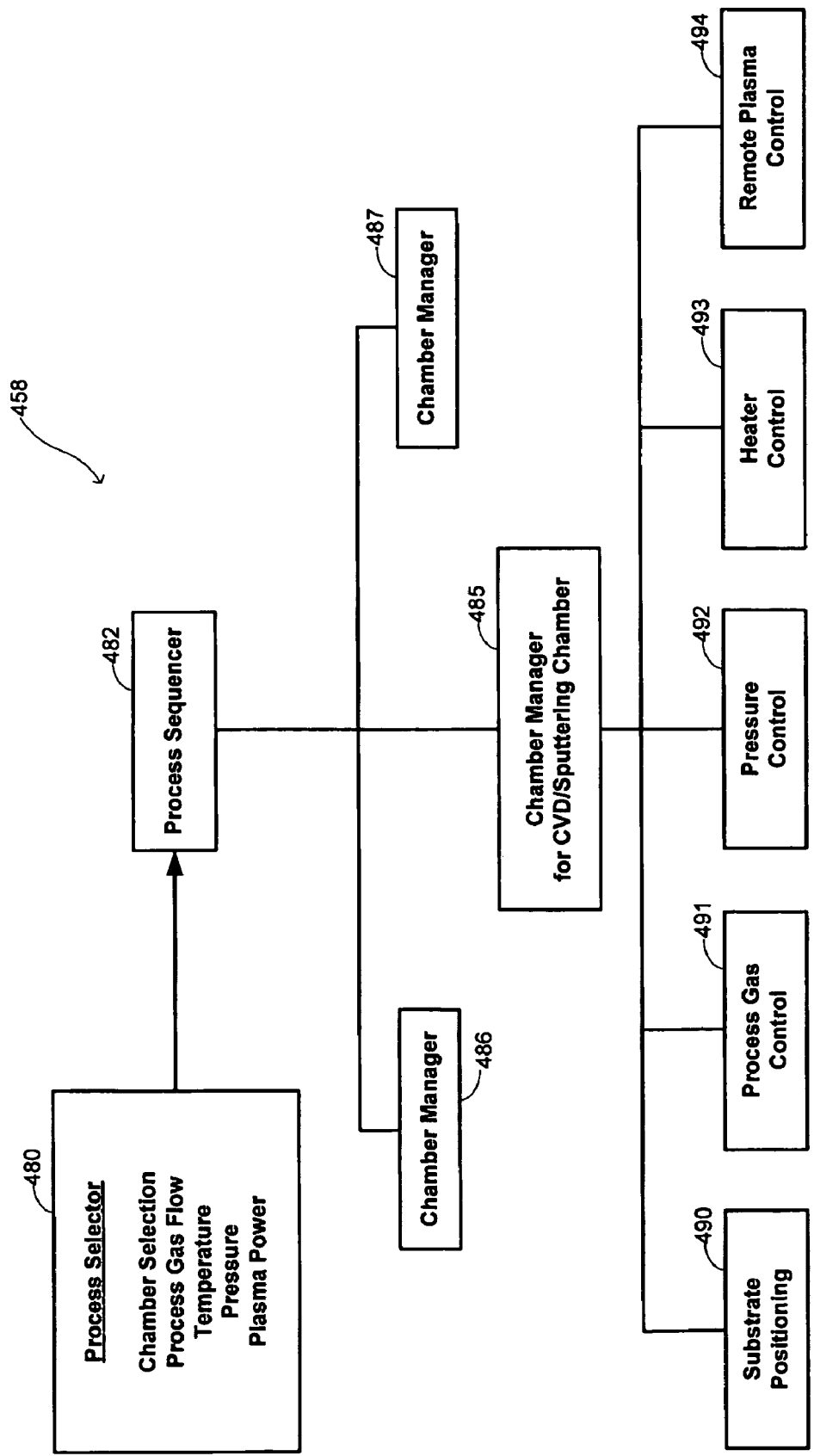
FIG. 4C is a block diagram of one embodiment of the hierarchical control structure of the system control software for the exemplary CVD apparatus of FIG. 4A.

FIG. 4C is a block diagram of one embodiment of the hierarchical control structure of the system control software, computer program 458, for the exemplary CVD apparatus of FIG. 4A. Processes such as those for depositing a layer, performing a dry chamber clean, or performing reflow or drive-in operations can be implemented under the control of computer program 458 that is executed by processor 450. The computer program code can be written in any conventional computer readable programming language, such as 68000 assembly language, C, C++, Pascal, Fortran, or other language. Suitable program code is entered into a single file, or multiple files, using a conventional text editor and is stored or embodied in a computer-usable medium, such as the system memory.

If the entered code text is in a high-level language, the code is compiled, and the resultant compiler code is then linked with an object code of precompiled Windows™ library routines. To execute the linked compiled object code, the system user invokes the object code, causing the computer system to load the code in memory, from which the CPU reads and executes the code to configure the apparatus to perform the t identified in the program.

A user enters a process set number and process chamber number into a process selector subroutine 480 by using the light pen to select a choice provided by menus or screens displayed on the CRT monitor. The process sets, which are predetermined sets of process parameters necessary to carry out specified processes, are identified by predefined set numbers. The process selector subroutine 480 identifies (i) the desired process chamber, and (ii) the desired set of process parameters needed to operate the process chamber for performing the desired process. The process parameters for performing a specific process relate to process conditions such as, for example, process gas composition and flow rates, pedestal temperature, chamber wall temperature, pressure and plasma conditions such as magnetron power levels. The process selector subroutine 480 controls what type of process (e.g. deposition, wafer cleaning, chamber cleaning, chamber gettering, reflowing) is performed at a certain time in the chamber. In some embodiments, there may be more than one process selector subroutine. The process parameters are provided to the user in the form of a recipe and may be entered utilizing the light pen/CRT monitor interface.

A process sequencer subroutine 482 has program code for accepting the identified process chamber and process parameters from the process selector subroutine 480, and for controlling the operation of the various process chambers. Multiple users can enter process set numbers and process chamber numbers, or a single user can enter multiple process set numbers and process chamber numbers, so process sequencer subroutine 482 operates to schedule the selected processes in the desired sequence. Preferably, process sequencer subroutine 482 includes program code to perform the steps of (i) monitoring the operation of the process chambers to determine if the chambers are being used, (ii) determining what processes are being carried out in the chambers being used, and (iii) executing the desired process based on availability of a process chamber and the type of process to be carried out.

Conventional methods of monitoring the process chambers, such as polling methods, can be used. When scheduling which process is to be executed, process sequencer subroutine 482 can be designed to take into consideration the present condition of the process chamber being used in comparison with the desired process conditions for a selected process, or the "age" of each particular user-entered request, or any other relevant factor a system programmer desires to include for determining scheduling priorities.

Once process sequencer subroutine 482 determines which process chamber and process set combination is going to be executed next process sequencer subroutine 482 initiates execution of the process set by passing the particular process set parameters to a chamber manager subroutine 485 which controls multiple processing tasks in a particular process chamber according to the process set determined by process sequencer subroutine 482. For example, chamber manager subroutine 485 has program code for controlling CVD and cleaning process operations in chamber 415. Chamber manager subroutine 485 also controls execution of various chamber component subroutines which control operation of the chamber components necessary to carry out the selected process set. Examples of chamber component subroutines are substrate positioning subroutine 490, process gas control subroutine 491, pressure control subroutine 492, heater control subroutine 493 and remote plasma control subroutine 494. Depending on the specific configuration of the CVD chamber, some embodiments include all of the above subroutines, while other embodiments may include only some of the subroutines or other subroutines not described. Those having ordinary skill in the art would readily recognize that other chamber control subroutines can be included depending on what processes are to be performed in the process chamber. In multichamber systems, additional chamber manager subroutines 486, 487 control the activities of other chambers.

In operation, the chamber manager subroutine 485 selectively schedules or calls the process component subroutines in accordance with the particular process set being executed. Chamber manager subroutine 485 schedules the process component subroutines much like the process sequencer subroutine 482 schedules which process chamber and process set are to be executed next. Typically, chamber manager subroutine 485 includes steps of monitoring the various chamber components, determining which components need to be operated based on the process parameters for the process set to be executed, and initiating execution of a chamber component subroutine responsive to the monitoring and determining steps.

Operation of particular chamber component subroutines will now be described with reference to FIGS. 4A and 4C. The substrate positioning subroutine 490 comprises program code for controlling chamber components that are used to load the substrate onto the heater 426 and, optionally, to lift the substrate to a desired height in the chamber to control the spacing between the substrate and the gas distribution manifold 421. When a substrate is loaded into the process chamber 415, the heater 426 is lowered to receive the substrate and then the heater 426 is raised to the desired height. In operation, the substrate positioning subroutine 490 controls movement of the heater 426 in response to process set parameters related to the support height that are transferred from the chamber manager subroutine 485.

Process gas control subroutine 491 has program code for controlling process gas composition and flow rates. Process gas control subroutine 491 controls the state of safety shut-off valves, and also ramps the mass flow controllers up or down to obtain the desired gas flow rate. Typically, process gas control subroutine 491 operates by opening the gas supply lines and repeatedly (i) reading the necessary mass flow controllers, (ii) comparing the readings to the desired flow rates received from the chamber manager subroutine 485, and (iii) adjusting the flow rates of the gas supply lines as necessary. Furthermore, process gas control subroutine 491 includes steps for monitoring the gas flow rates for unsafe rates, and activating the safety shut-off valves when an unsafe condition is detected. Alternative embodiments could have more than one process gas control subroutine, each subroutine controlling a specific type of process or specific sets of gas lines.

In some processes, an inert gas, such as nitrogen or argon, is flowed into the chamber to stabilize the pressure in the chamber before reactive process gases are introduced. For these processes, process gas control subroutine 491 is programmed to include steps for flowing the inert gas into the chamber for an amount of time necessary to stabilize the pressure in the chamber, and then the steps described above would be carried out. Additionally, when a process gas is to be vaporized from a liquid precursor, process gas control subroutine 491 is written to include steps for bubbling a delivery gas such as helium through the liquid precursor in a bubbler assembly, or controlling a liquid injection system to spray or squirt liquid into a stream of carrier gas, such as helium. When a bubbler is used for this type of process, process gas control subroutine 491 regulates the flow of the delivery gas, the pressure in the bubbler, and the bubbler temperature in order to obtain the desired process gas flow rates. As discussed above, the desired process gas flow rates are transferred to process gas control subroutine 491 as process parameters.

Furthermore, process gas control subroutine 491 includes steps for obtaining the necessary delivery gas flow rate, bubbler pressure, and bubbler temperature for the desired process gas flow rate by accessing a stored table containing the necessary values for a given process gas flow rate. Once the necessary values are obtained, the delivery gas flow rate, bubbler pressure and bubbler temperature are monitored, compared to the necessary values and adjusted accordingly.

The pressure control subroutine 492 includes program code for controlling the pressure in the chamber by regulating the aperture size of the throttle valve in the exhaust system of the chamber. The aperture size of the throttle valve is set to control the chamber pressure at a desired level in relation to the total process gas flow, the size of the process chamber, and the pumping set-point pressure for the exhaust system. When the pressure control subroutine 492 is invoked, the desired or target pressure level is received as a parameter from the chamber manager subroutine 485. Pressure control subroutine 492 measures the pressure in the chamber by reading one or more conventional pressure manometers connected to the chamber, compares the measure value(s) to the target pressure, obtains proportional, integral, and differential ("PID") values corresponding to the target pressure from a stored pressure table, and adjusts the throttle valve according to the PID values. Alternatively, the pressure control subroutine 492 can be written to open or close the throttle valve to a particular aperture size, i.e. a fixed position, to regulate the pressure in the chamber. Controlling the exhaust capacity in this way does not invoke the feedback control feature of the pressure control subroutine 492.

Heater control subroutine 493 includes program code for controlling the current to a heating unit that is used to heat the substrate. Heater control subroutine 493 is also invoked by the chamber manager subroutine 485 and receives a target, or set-point, temperature parameter. Heater control subroutine 493 measures the temperature, which may be performed in different ways in different embodiments. For instance, a calibrated temperature may be determined by measuring voltage output of a thermocouple located in the heater, comparing the measured temperature to the set-point temperature, and increasing or decreasing current applied to the heating unit to obtain the set-point temperature. The temperature is obtained from the measured voltage by looking up the corresponding temperature in a stored conversion table, or by calculating the temperature using a fourth-order polynomial. In another embodiment, a similar process may be performed with a pyrometer instead of a thermocouple to determine a calibrated temperature. Heater control subroutine 493 includes the ability to gradually control a ramp up or down of the heater temperature. In embodiments where the heater comprises a resistive heating element enclosed in ceramic, this feature helps to reduce thermal cracking in the ceramic, although this is not a concern in those embodiments that use a lamp heater Additionally, a built-in fail-safe mode can be included to detect process safety compliance, and can shut down operation of the heating unit if the process chamber is not properly set up.

Remote plasma control subroutine 494 includes program code to control the operation of remote plasma system 430. Plasma control subroutine 494 is invoked by chamber manager 485 in a manner similar to the other subroutines just described.

Although the invention is described herein as being implemented in software and executed upon a general purpose computer, those of skill in the art will realize that the invention could be implemented using hardware such as an application specific integrated circuit (ASIC) or other hardware circuitry. As such, it should be understood that the invention can be implemented, in whole or in part is software, hardware or both. Those skilled in the art will also realize that it would be a matter of routine skill to select an appropriate computer system to control CVD system 410.

3. Exemplary Embodiments

A number of examples are provided to illustrate dual-sided deposition. In some instances, deposition takes place on two sides of a single substrate. Deposition on one of the sides may be sacrificial in some embodiments or the deposition on both sides may be used in fabrication of devices. In other instances, deposition takes place on different substrates, which may be stacked without bonding or bonded during deposition and subsequently split.

Figure 5A:
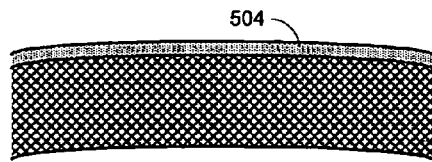
FIGS. 5A and 5B illustrate accommodating physical distortions of nitride-based structures with dual-sided deposition.
Figure 5B:
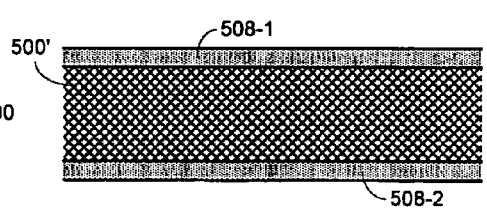

A first illustration of how double-sided deposition may proceed is illustrated with FIGS. 5A-7, which show an embodiment in which deposition is performed on both sides of a single substrate. A comparison of the shapes that result with single-sided and double-sided deposition is provided with FIGS. 5A and 5B. In FIG. 5A, the bowing described above results when a nitride layer 504 is deposited over a substrate and then cooled. When deposition is performed on both sides, however, such as by depositing nitride layers 508 over substrate 500' in FIG. 5B, the bowing is significantly reduced. If identical deposition were obtained on both sides of the substrate, the bowing would be completely eliminated.

Figure 6:
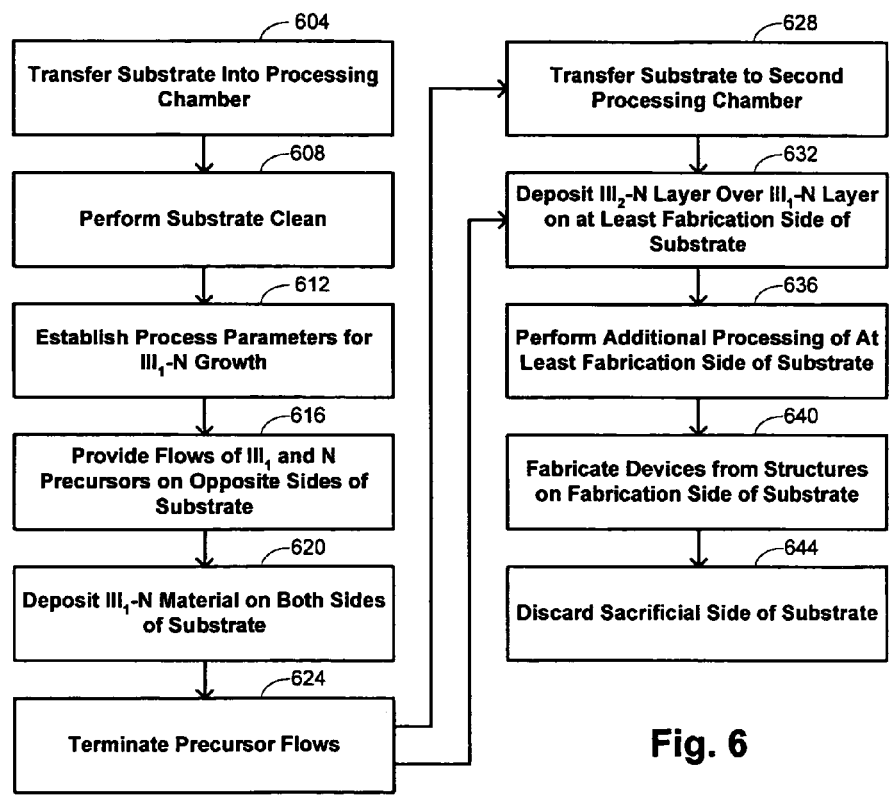
FIG. 6 provides a flow diagram of a process that may be used in some embodiments to achieve the dual-sided deposition illustrated in FIG. 5B.

A method for such double-sided deposition is illustrated with the flow diagram of FIG. 6. The process begins at block 604 by transferring a substrate into a substrate processing chamber. For deposition of a nitride structure, the substrate may comprise sapphire, although other materials that may be used include SiC, Si, spinet, lithium gallate, ZnO, and others. The substrate is cleaned at block 608, after which process parameters suitable for growth of a nitride layer may be established at block 612. Such process parameters may include temperature, pressure, and the like to define an environment within the processing chamber appropriate for thermal deposition of a nitride layer. Flows of precursors are provided at block 616 on opposite sides of the substrate to deposit $III_1$-N structures on both sides of the substrate at block 620. The precursors include a nitrogen source and a source for a first group-III element such as Ga. For instance, suitable nitrogen precursors include $NH_3$ and suitable Ga precursors include trimethyl gallium ("TMG"). The first group-m element may sometimes comprise a plurality of distinct group-III elements such as Al and Ga, in which case a suitable Al precursor may be trimethyl aluminum ("TMA"); in another example, the plurality of distinct group-III elements includes In and Ga, in which case a suitable In precursor may be trimethyl indium ("TMI"). A flow of a carrier gas such as $N_2$ and/or $H_2$ may also be included.

After deposition of the $III_1$-N structure at block 620, the precursor flows are terminated at block 624. Subsequent deposition steps may be performed in the same processing chamber or may be performed in a different processing chamber, such as in applications that make use of a cluster tool as described above. If subsequent steps are to be performed in a separate processing chamber, the substrate is transferred to a second processing chamber at block 628. In either case, a $III_2$-N layer is deposited over the $III_1$-N layer on at least a fabrication side of the substrate and more usually on both sides of the substrate. In some instances, still further additional processing may be performed on at least the fabrication side of the substrate as indicated at block 636.

Deposition of the $III_2$-N layer is performed by establishing suitable processing parameters such as temperature, pressure, and the like for such deposition. In some instances, the $III_2$-N structure includes a group-r element that is not comprised by the $III_1$-N layer, although the $III_1$-N and $III_2$-N layers may additionally comprise a common group-III element. For instance, in the case where the $III_1$-N layer is GaN, the $III_2$-N layer may be an AlGaN layer or an InGaN layer. While these are examples in which the $III_2$-N layer has a ternary composition, this is not required by the invention and the $III_2$ layer may more generally include such other compositions as quaternary AlInGaN layers. Similarly, in the case where the $III_1$-N layer is AlGaN, the $III_2$-N layer may be an InGaN layer on an AlInGaN layer. Suitable precursors for deposition of the $III_2$-N layer may be similar to the precursors used for the $III_1$ layer, i.e. $NH_3$ is a suitable nitrogen precursor, TMG is a suitable gallium precursor, TMA is a suitable aluminum precursor, and TMI is a suitable indium precursor. A carrier case such a $N_2$ and/or $H_2$ may also be included.

The processing conditions used for deposition of the $III_1$-N and $III_2$-N layers may vary depending on specific applications. The following table provides exemplary processing conditions and precursor flow rates that are generally suitable in the growth of nitride semiconductor structures using the devices described above:

| Parameter | Value |
| --- | --- |
| Temperature (° C.) | 500-1500 |
| Pressure (torr) | 50-1000 |
| TMG flow (sccm) | 0-50 |
| TMA flow (sccm) | 0-50 |
| TMI flow (sccm) | 0-50 |
| $PH_3$ flow (sccm) | 0-1000 |
| $AsH_3$ flow (sccm) | 0-1000 |
| $NH_3$ flow (sccm) | 100-100,000 |
| $N_2$ flow (sccm) | 0-100,000 |
| $H_2$ flow (sccm) | 0-100,000 |

As will be evident from the preceding description, a process might not use flows of all the precursors in any given process. For example, growth of GaN might use flows of TMG, $NH_3$, and $N_2$ in one embodiment; growth of AlGaN might use flows of TMG, TMA. $NH_3$, and $H_2$ in another embodiment, with the relative flow rates of TMA and TMG selected to provide a desired relative Al:Ga stoichiometry of the deposited layer, and growth of InGaN might use flows of TMG, TMI, $NH_3$, $N_2$, and $H_2$ in still another embodiment, with relative flow rates of TMI and TMG selected to provide a desired relative In:Ga stoichiometry of the deposited layer.

Because the shape deformities are largely or completely avoided, the dual-sided deposition achieves improved characteristics of devices fabricated from the fabrication side of the substrate at block 640. For example, when an InGaN quantum-well active region is deposited over a GaN layer, the active region has improved alloy-composition uniformity that results from a more constant surface temperature across the substrate. The wavelength and power output of fabricated devices are thus also more uniform, improving the overall yield. Lithographic processing of the substrate into LED or laser-ode chips is simplified because the patterning is performed on a flatter surface, avoiding complications that result from implementing either contact or projection lithography on a curved surface. The sacrificial side of the substrate may accordingly be discarded as indicated at block 644.

In some embodiments, deposition on the fabrication and sacrificial sides of the substrate is intentionally different. In particular, the stress characteristics that attempt to deform the structure when cooled may depend on the particular composition of the deposited materials. In some embodiments, specific stress characteristics are accommodated by growing the sacrificial material to a different thickness than the fabrication material.

Figure 7:
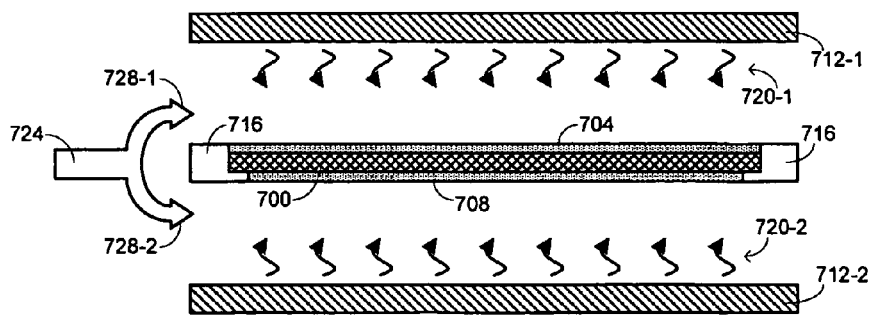
FIG. 7 provides an illustration of a structure that may be incorporated in the CVD apparatus of FIG. 4A to provide dual-sided deposition.

A more detailed illustration of a substrate support structure is provided in FIG. 7. In this drawing the substrate 700 is supported by a substrate support structure 716 that permits access by precursor flows 728 to both sides of the substrate 700. The elements are arranged geometrically with respect to an input flow 724 of precursors so that the flow separates into flows 728 that pass along both sides of the substrate 700. The heater arrangement in this illustration comprises a pair of plates 712 disposed on opposite sides of the substrate support structure 716 to provide heat 720 to each side of the substrate 700. As previously noted, suitable materials for the plates 712 comprise graphite or SiC, among other materials. The combination of precursor flows 728 and heat 720 permit the growth of layers 704 and 708 on opposite sides of the substrate 700.

One technique that may be used to fabricate devices like LEDs or laser diodes from the deposited structures is an epitaxial lift-off process. Such a process uses exposure to ultraviolet light at sufficient intensity to cause local decomposition of the nitride layer at the growth interface with the substrate. The light may be projected through the deposited sacrificial material and the substrate to cause decomposition at the interface on the fabrication side of the substrate. One source of ultraviolet light that may be used in such a process is a pulsed excimer laser. Layers on the sacrificial side of the substrate may be substantially destroyed by exposure to the direct excimer radiation.

While the structure formed using the method of FIG. 6 includes a sacrificial deposition that acts to reduce shape deformation during the process, it is possible in some instances to use growth on both sides of a substrate arrangement to produce devices. In particular, the growth of similar or identical heterostructures on both surfaces permits the throughput to be approximately doubled. This is done in one embodiment using the process shown in FIG. 8 by providing a stacked arrangement of substrates so that deposition on opposite sides of the structure actually takes place on different substrates. The physical arrangement that is used is a modification of the arrangement shown in FIG. 7 and is illustrated in FIG. 9A.

Figure 8:
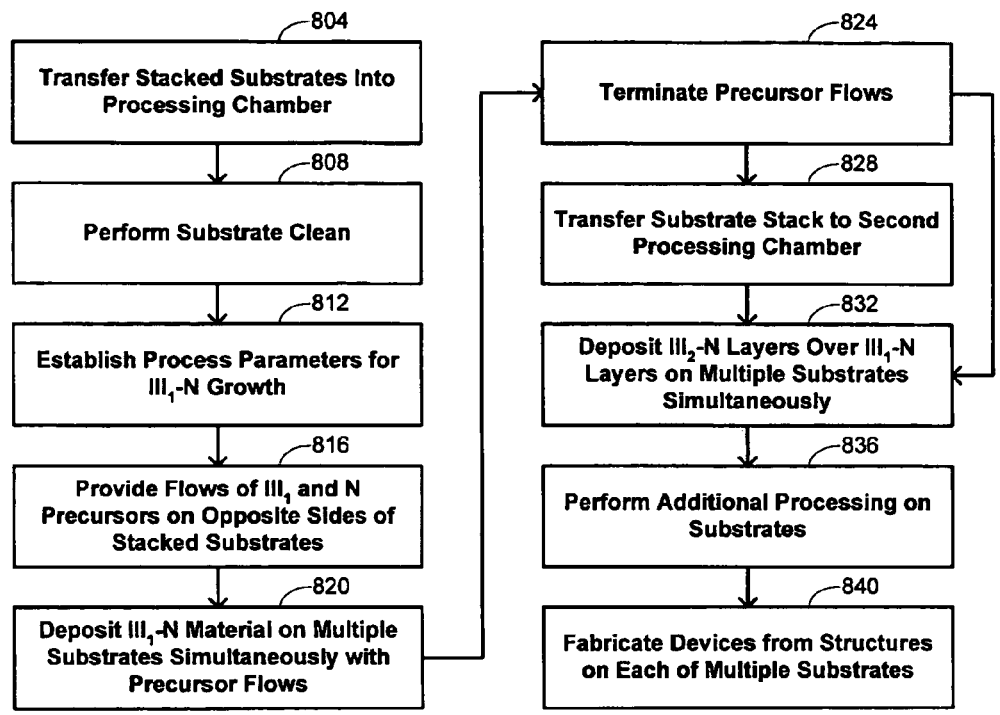
FIG. 8 is a flow diagram of an alternative deposition process that provides deposition on opposite sides of a substrate stack.

The process begins at block 804 of FIG. 8 by transferring the stacked substrate arrangement into the processing chamber. The stacked substrate arrangement comprises a plurality of substrates, the outermost ones of which are suitable for deposition of nitride material. In the illustrations that follow, the stacked substrate arrangement consists of two substrates, with material being deposited on both of the substrates, but other embodiments could include one or more intermediate substrates to achieve desired separations of the two fabrication substrates or for other reasons. A substrate clean is performed at block 808 to clean the fabrication surfaces of each of the outer substrates.

The processing of the cleaned substrates is similar to that described in connection with FIG. 6. At block 812, process parameters such as temperature, pressure, and the like, are established to promote $III_1$-N growth when corresponding precursors for $III_1$ and N elements are provided at block 816. Growth occurs on the fabrication side of each of the outer substrates in the stacked substrate arrangement at block 820. After termination of the precursor flows at block 824 when deposition of the $III_1$-N material is complete, the stacked substrate arrangement may be transferred to a second processing chamber for further processing at block 828. Irrespective of whether such a transfer takes place, $III_2$-N layers are deposited over the $III_1$-N layers at block 832. The $III_2$-N layers may include a group-M element not included in the $III_1$-N layers, but even in such circumstances may also sometimes include a common group-III element as described above. Additional processing may be performed on the outer substrates at block 836, permitting final processing often substrates into device chips at block 840.

Figure 9A:
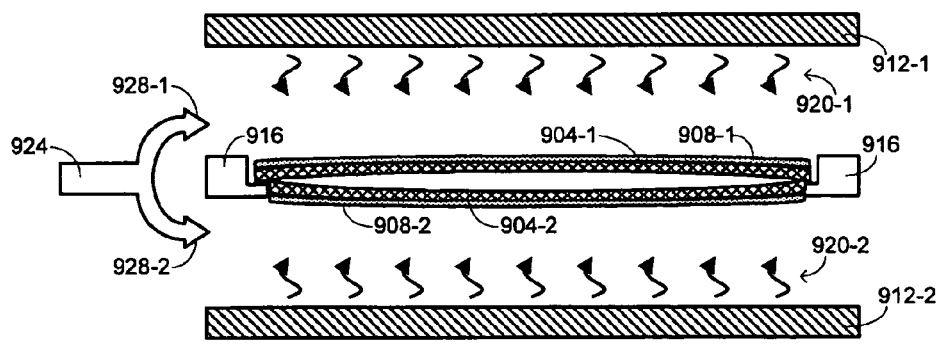
FIG. 9A provides an illustration of a structure that may be incorporated in the CVD apparatus of FIG. 4A to provide deposition on opposite sides of a substrate stack.

It is apparent from FIG. 9A that the general arrangement of the substrate support structure 916, heaters 912, and precursor flows 924 may be similar to that shown in FIG. 7. Growth of layers 908 on each of the outer substrates 904 results from the application of heat 920 from the heaters 912 to separated precursor flows 928 over the substrates 904. In this instance, deposition is on only one side of each of the substrates, so there is still some bowing deformation. But because the mechanic of substrate heating relies on proximity to heated plates, as opposed to relying on direct contact with a susceptor, the bowing is expected to have a reduced impact on the substrate surface temperature. This difference in temperature characteristics permits the composition of layers deposited at lower temperatures, such as a subsequently deposited InGaN multi quantum-well layer still to be reasonably uniform.

Figure 9B:
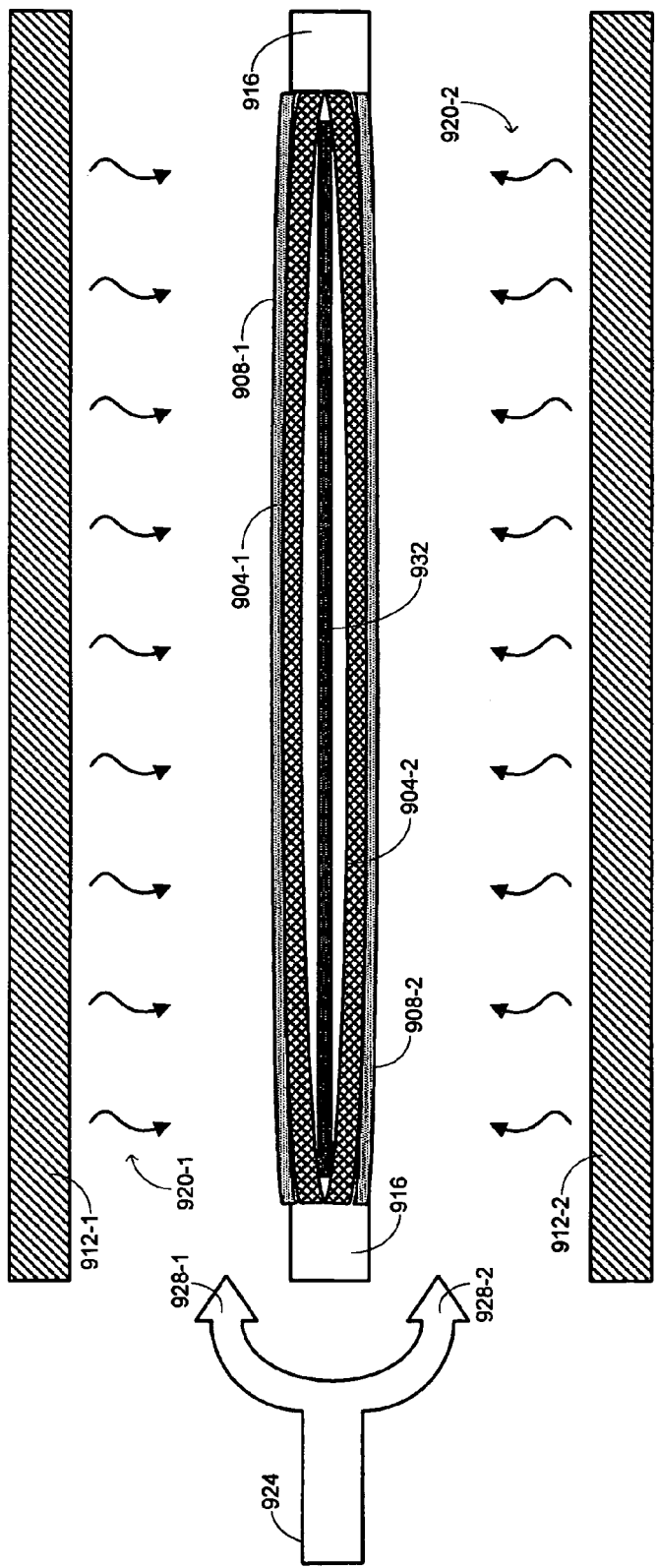
FIG. 9B provides an expanded view of the structure of FIG. 9A and illustrates an embodiment in which an infrared absorber is included.

FIG. 9B provides an expanded view of the arrangement of FIG. 9A and illustrates that in some embodiments an infrared absorber 932 may be included between the substrates 904. The absorber 932 may be provided as a plate of infrared-absorbing material such as SiC, SiC-coated graphite, molybdenum, or the like. The presence of the infrared absorber in this location acts to enhance the heating and temperature uniformity, thereby resulting in more uniform deposition over each of the outer substrates 904.

A variation of the embodiments illustrated in FIGS. 8 and 9A provides the stacked substrate arrangement as a bonded stacked substrate arrangement that is unbonded after deposition of the relevant layers. A exemplary sequence that uses such a configuration is shown schematically in FIG. 10. In this illustration, a plurality of distinct substrates 1004, identified collectively in the drawing by reference number 1010, is bonded together to produce the bonded stacked substrate arrangement 1020. There are a number of different mechanisms by which the bonding may be performed. For instance, a semiconductor-to-semiconductor substrate bond may be used, such as may be achieved through deposition of InGaN layers deposited on the bonding surfaces. Alternatively, a metal bonding process may be used, such as by using refractory metals stable under the subsequent growth conditions that include a high temperature and reactive ambient. In still other instances, bonding may be achieved with a metal having a lower metal point that would hold the substrates together even if liquid at subsequent processing temperatures through surface tension. Similarly, other materials such as sol-gel ceramics, spin-on glass, etc., may be used for bonding provided they have sufficient chemical and thermal stability in the processing environment. Such materials are advantageously amenable to subsequent separation through chemical selectivity or with some physical process like ultrasonic fracture or laser separation. The invention is not intended to be limited to any particular bonding technique or material, provided the bond is sufficiently strong to withstand bowing forces that arise during growth as a result of differences in thermal expansion.

Epitaxial growth processes are performed on the bonded stacked substrate arrangement to deposit material 1008 on opposite sides of the stacked structure to produce structure 103D. Preferably, similar or identical heterostructures are deposited on both surfaces to improve overall throughput. Since the deposition is dual sided, little or no bowing occurs during growth.

Figure 10:
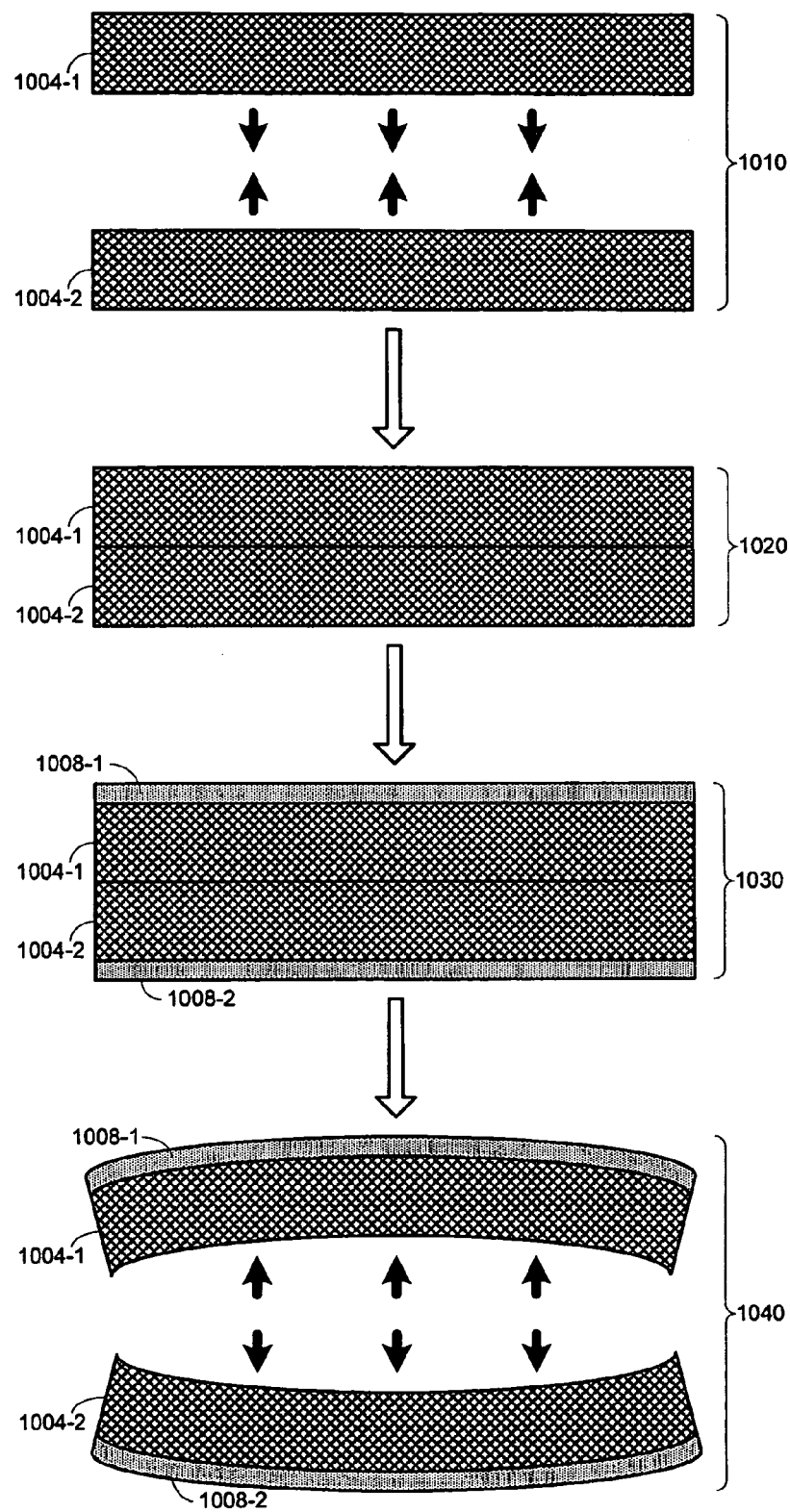
FIG. 10 illustrates a sequence of fabrication steps that combine deposition on opposite sides of a substrate stack with substrate separation as part of a split-substrate process.

After growth, the stacked substrate arrangement is split into separate portions, identified collectively by reference number 1040 in FIG. 10. The splitting occurs along the bonding boundary between the component substrates 1004. Different techniques may be used to split the substrates, and the suitability of certain splitting techniques may depend on the material and technique used to achieve the initial bonding. For example, for metallic or silicon-on-glass bonding, an acid etch may be used to undercut the metal/glass bonding layers. A suitable splitting technique that may be used with semiconducting InGaN bonding layers includes exposure to ultraviolet light, which will act to decompose the bonding layers. Such light may be applied by illuminating through the device layers on either or both sides of the stacked structure. Other splitting techniques that may be used include fracture induced by focused ultrasonic energy or pulsed laser. It is noted that such techniques may be suitable in some instances for splitting bulk substrates when two-sided deposition is performed on a single substrate.

After separation, the resulting individual structures are bowed as a consequence of the thermal mismatch between the deposited nitride layer and the underlying substrate in each structure. But the technique permits the majority of the device processing to be performed on the unsplit stacked arrangement when substantially flat surfaces are available for processing. Indeed, in some instances, the splitting is not performed until after the completion of all lithographic processing and die formation are performed on the outer surfaces. Furthermore, in some embodiments, the splitting is performed on individual dies after their formation by sawing or cleaving.

In other embodiments, the tendency towards bowing of the structures is exploited to achieve the desired splitting. This bowing tendency is a manifestation of forces that arise as a result differential thermal expansion of the different materials. These forces are naturally greater at lower temperatures. Thus, when the stacked structure is cooled to room temperature after completion of the desired depositions, these forces are stronger than at any time during the depositions. This is a consequence of the structure having been completely grown to its full thickness, thereby experiencing the greatest differential temperature after cooldown. A substrate bond may thus be provided to survive the more modest stresses during growth but be insufficient to withstand the greater stress after being cooled to room temperature. In these embodiments, substrate splitting thus occurs substantially spontaneously during cooldown after growth.

In still other embodiments, deposition of fabrication layers is performed on opposite sides of a single substrate. As mentioned above, splitting techniques like focusing ultrasonic energy or pulsing laser energy may be used to split the single substrate after processing. Another technique that may accomplish the desired splitting of a single substrate uses a substrate that has been implanted and annealed to generate the stress that induces splitting.

A further technique uses a modification of the epitaxial lift-off process described above when sacrificial and fabrication depositions were made on opposite sides of a substrate. In a variant of that technique, fabrication is provided from both sides of the substrate by initiating growth on each side of the substrate with a high-indium-content InGaN. An excimer laser source is tuned to a wavelength where the LED active region is transparent. With such an arrangement, the light is absorbed substantially exclusively in the InGaN interface buffer layer, permitting epitaxial lift-off without substantial damage to the device structures.

Figure 11:
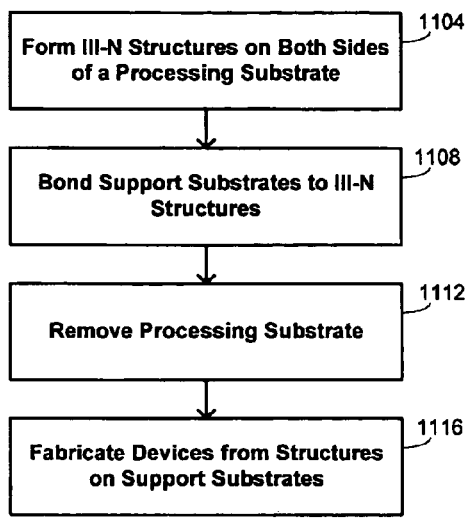
FIG. 11 is a flow diagram summarizing epitaxial lift-off methods that use deposition on opposite sides of a single substrate.
Figure 12:
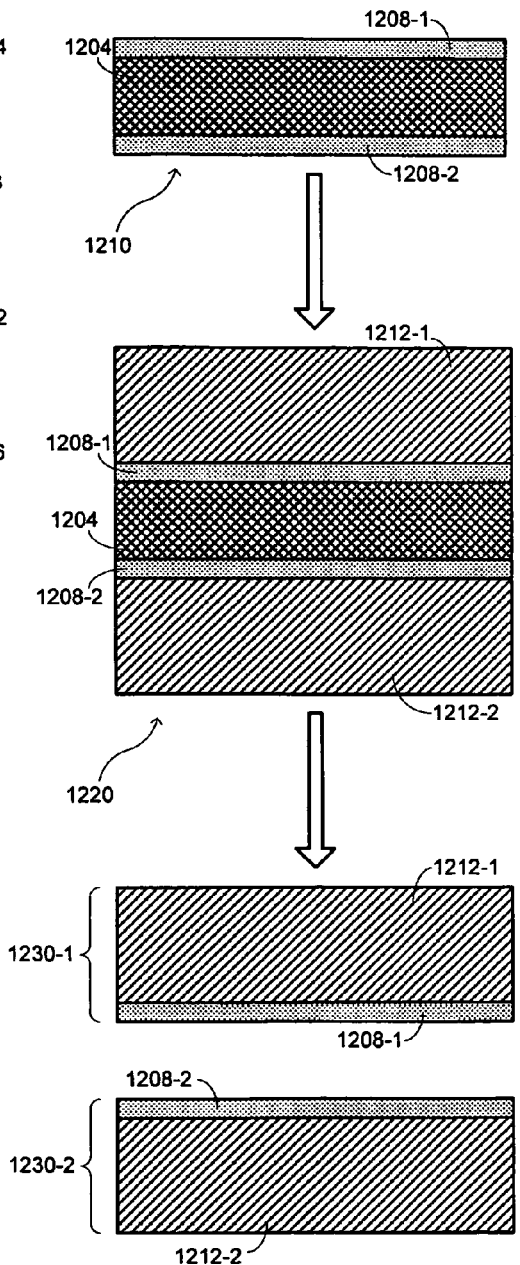
FIG. 12 illustrates a sequence of steps corresponding to steps in the flow diagram of FIG. 11.

An additional technique for harvesting devices from the two fabrication layers is illustrated with the flow diagram of FIG. 11 and the corresponding schematic drawings of FIG. 12. As indicated at block 1104 of FIG. 11, III-N structures 1208 are formed on both sides of a processing substrate 1204 to produce structure 1210 shown in FIG. 12. Support substrates 1212 are subsequently bonded to the III-N structures at block 1108 of FIG. 11 to form structure 1220 of FIG. 12. Such bonding may be performed with a variety of different techniques, including waxing metal bonding, soldering, and the like. The support substrates 1212 provide mechanical stability after lift-off, which may be achieved by removing the processing substrate 1204 at block 1112 of FIG. 12 to produce a pair of structures 1230 having the III-N structures 1208 bonded to respective support substrates 1212. Removal of the processing substrate may be performed in a number of different ways, such as by using the technique of void-assisted separation as described in, e.g., Y. Oshima et al., "Preparation of free-standing GaN wafers by hydride VPE with Void-Assisted Separation," Jpn. J. Appl. Phys. 42, L1 (2003), the entire disclosure of which is incorporated herein by reference for all purposes. Such a technique is especially suitable when the substrate comprise sapphire or SiC. In other instances, the processing substrate may be removed by undercutting with a wet chemical etch; such a technique is especially suitable when the substrate comprises silicon.

The process is completed at block 1116 by fabricating devices such as LEDs or laser diodes from the structures on the support substrates. Such final fabrication may comprise lithographic processing of the structures 1230. In some instances, the support substrates 1212 are not merely sacrificial substrates but are selected to be incorporated as part of the final package. Examples of features that may be comprised by the support substrates 1212 thus include heat-sinking and/or light-extraction function.

Having fully described several embodiments of the present invention, many other equivalent or alternative methods of producing the cladding layers of the present invention will be apparent to those of skill in the art. These alternatives and equivalents are intended to be included within the scope of the invention, as defined by the following claims.

What is claimed is:

1. A method of fabricating compound nitride semiconductor structures, the method comprising:

flowing a first group-III precursor and a first nitrogen precursor into a first processing chamber, the first group-III precursor comprising a first group-III element;

depositing a first layer over a surface of a first sapphire substrate with a thermal chemical-vapor-deposition process within the first processing chamber using the first group-III precursor and the first nitrogen precursor, the first layer comprising nitrogen and the first group-III element;

depositing a second layer over a surface of a second sapphire substrate with the thermal chemical-vapor-deposition process within the first processing chamber using the first group-III precursor and the first nitrogen precursor, the second layer comprising nitrogen and the first group-III element, wherein:
the first and second sapphire substrates are different outer substrates of a plurality of stacked substrates bonded together and disposed within the first processing chamber as a stack;
the first layer and second layer are deposited on opposite sides of the stack; and
depositing the first layer and depositing the second layer are performed simultaneously, further comprising splitting the first and second sapphire substrates from the stack after deposition the first layer and depositing the second layer, wherein splitting the first and second sapphire substrates from the stack comprises cooling the stack to induce a splitting force from a differential thermal expansion between the first layer and the first sapphire substrate and between the second layer and the second sapphire substrate.

2. The method recited in claim 1 wherein the plurality of stacked substrates are bonded together with a bond selected from the group consisting of a semiconductor-to-semiconductor bond, a metal bond, a sol-gel ceramic bond, and a spin-on-glass bond.

3. The method recited in claim 1 wherein splitting the first and second sapphire substrates from the stack comprises using an acid etch to decompose the bond with at least one of the first and second substrates.

4. The method recited in claim 1 wherein splitting the first and second sapphire substrates from the stack comprises exposing the bond with at least one of the first and second sapphire substrates to ultraviolet light to decompose the bond.

5. The method recited in claim 1 wherein splitting the first and second sapphire substrates from the stack comprises inducing a mechanical fracture of the bond with at least one of the first and second sapphire substrates.

6. The method recited in claim 1 further comprising cooling the stack after depositing the first and second layers without substantially deforming a shape of the first sapphire substrate or a shape of the second sapphire substrate.

7. The method recited in claim 1 further comprising simultaneously heating the surface of the first sapphire substrate and the surface of the second sapphire substrate radiatively with plates disposed on opposite sides of the stack.

8. The method recited in claim 1 wherein the stack comprises an infrared absorber disposed between the first and second sapphire substrates.

9. The method recited in claim 8 wherein the infrared absorber is a plate comprising SiC, SiC-coated graphite, or molybdenum.

10. A method of fabricating compound nitride semiconductor structures, the method comprising:
flowing a first group-III precursor and a first nitrogen precursor into a first processing chamber, the first group-III precursor comprising a first group-III element;
depositing a first layer over a surface of a first sapphire substrate with a thermal chemical-vapor-deposition process within the first processing chamber using the first group-III precursor and the first nitrogen precursor, the first layer comprising nitrogen and the first group-III element;
depositing a second layer over a surface of a second sapphire substrate with the thermal chemical-vapor-deposition process within the first processing chamber using the first group-III precursor and the first nitrogen precursor, the second layer comprising nitrogen and the first group-III element, wherein:
the first and second sapphire substrates are different outer substrates of a plurality of stacked substrates disposed within the first processing chamber as a stack;
the first layer and second layer are deposited on opposite sides of the stack;
depositing the first layer and depositing the second layer are performed simultaneously; and
depositing the first layer and depositing the second layer are performed at a first temperature, the method further comprising:
depositing a third layer over the first layer with a thermal chemical-vapor-deposition process, the third layer comprising nitrogen and a second group-III element not comprised by the first group-III precursor; and
depositing a fourth layer over the second layer with a thermal chemical-vapor-deposition process, the fourth layer comprising nitrogen and the second group-III element,
wherein depositing the third layer and depositing the fourth layer are performed simultaneously at a second temperature less than the first temperature.

11. The method recited in claim 10 wherein depositing the third layer and depositing the fourth layer are performed in the first processing chamber.

12. The method recited in claim 10 wherein depositing the third layer and depositing the fourth layer are performed in a second processing chamber different from the first processing chamber, the method further comprising transferring the substrate stack from the first processing chamber to the second processing chamber after depositing the first and second layers.

* * * * *